(12) United States Patent
Kim et al.

(10) Patent No.: US 9,354,733 B2
(45) Date of Patent: May 31, 2016

(54) FLEXIBLE DISPLAY MODULE

(71) Applicant: SAMSUNG DISPLAY CO., LTD., Yongin, Gyeonggi-Do (KR)

(72) Inventors: Youngseok Kim, Yongin (KR); Woo-Jong Lee, Yongin (KR); Jung-Hoon Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 98 days.

(21) Appl. No.: 14/037,670

(22) Filed: Sep. 26, 2013

(65) Prior Publication Data
US 2014/0267949 A1 Sep. 18, 2014

(30) Foreign Application Priority Data
Mar. 18, 2013 (KR) .................. 10-2013-0028817

(51) Int. Cl.
*G02F 1/1335* (2006.01)
*G06F 3/041* (2006.01)
*G02F 1/1333* (2006.01)
*H05K 1/14* (2006.01)
*G06F 1/16* (2006.01)
*G06F 1/20* (2006.01)

(52) U.S. Cl.
CPC ............ *G06F 3/041* (2013.01); *G02F 1/13338* (2013.01); *G06F 1/1635* (2013.01); *G06F 1/1652* (2013.01); *G06F 1/203* (2013.01); *G06F 2203/04103* (2013.01); *H05K 1/147* (2013.01); *H05K 2201/056* (2013.01); *H05K 2201/058* (2013.01)

(58) Field of Classification Search
None
See application file for complete search history.

(56) References Cited

U.S. PATENT DOCUMENTS

| | | | |
|---|---|---|---|
| 2002/0118333 A1* | 8/2002 | Koiwa et al. | 349/161 |
| 2006/0022910 A1 | 2/2006 | Sekiya et al. | |
| 2009/0195516 A1* | 8/2009 | Kuo | G06F 3/0412 345/174 |
| 2010/0110328 A1* | 5/2010 | Tatebayashi | G02B 6/0091 349/58 |
| 2012/0107675 A1 | 5/2012 | Kim | |
| 2013/0154984 A1* | 6/2013 | Gondo | 345/173 |
| 2014/0092040 A1* | 4/2014 | Nagao et al. | 345/173 |
| 2014/0118942 A1* | 5/2014 | Cheng et al. | 361/700 |

FOREIGN PATENT DOCUMENTS

| | | |
|---|---|---|
| JP | 2006-047408 A | 2/2006 |
| JP | 2008-185653 A | 8/2008 |
| KR | 10 2005-0050918 A | 6/2005 |
| KR | 10 2005-0093193 A | 9/2005 |
| KR | 10 2007-0011695 A | 1/2007 |
| KR | 10 2012-0040983 A | 4/2012 |
| KR | 10 2012-0041588 A | 5/2012 |
| KR | 10 2012-0047031 A | 5/2012 |

* cited by examiner

*Primary Examiner* — Richard Kim
(74) *Attorney, Agent, or Firm* — Lee & Morse, P.C.

(57) ABSTRACT

A flexible display module includes a panel having a display unit thereon, and a built-in battery which supplies an internal power source to the panel, for driving the display unit.

10 Claims, 5 Drawing Sheets

FLEXIBLE DISPLAY MODULE

CROSS-REFERENCE TO RELATED PATENT APPLICATION

This application claims the benefit of Korean Patent Application No. 10-2013-0028817, filed on Mar. 18, 2013, in the Korean Intellectual Property Office, the disclosure of which is incorporated herein in its entirety by reference.

BACKGROUND

1. Field

Embodiments relate to a flexible display module.

2. Description of the Related Art

Generally, a flexible display module is a module in which a display unit is formed on a flexible panel made of a flexible material such as polyimide, to add flexibility to the module. When carrying the module, the form of the module may be changed to reduce volume thereof.

SUMMARY

Embodiments are directed to a flexible display module, including a panel having an display unit thereon, and a built-in battery which supplies an internal power source to the panel, for driving the display unit.

The flexible display module may further include a printed circuit board connecting the panel to an external power source.

The built-in battery may be charged in state of being connected to the external power source through the printed circuit board.

A driver IC chip may be provided on the panel to drive the display unit, and the built-in battery may supply power to the driver IC chip through the printed circuit board.

The panel may be a touch-screen functional panel, and the built-in battery may supply power for the touch-screen functional function through the printed circuit board.

The flexible display module may further include a window covering a side of the panel.

A heat-radiating sheet may be provided on an opposite side of the panel to radiate heat generated from the built-in battery.

The heat-radiating sheet may include a graphite material.

The flexible display module may further include a cooling device to cool heat generated from the built-in battery.

The cooling device may include a cooling fan.

The built-in battery may be in a form of a sheet.

The built-in battery may be in a form of a sheet that extends in a plane parallel to a plane of the panel.

The built-in battery may be in a form of a sheet that extends in a plane parallel to a plane of the panel, and the panel may be interposed between the built-in battery and the window.

BRIEF DESCRIPTION OF THE DRAWINGS

Features will become apparent to those of skill in the art by describing in detail example embodiments with reference to the attached drawings in which.

DETAILED DESCRIPTION

Figure 1:
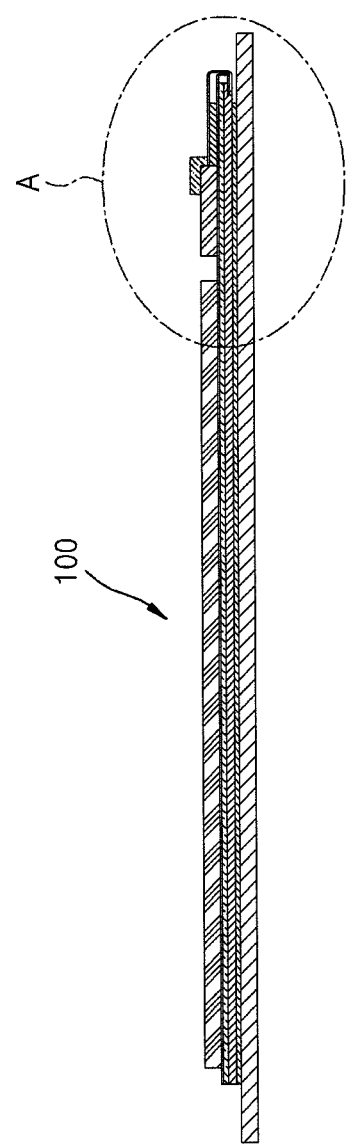
FIG. 1 is a side view of a flexible display module according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. Like reference numerals refer to like elements throughout.

Figure 2:
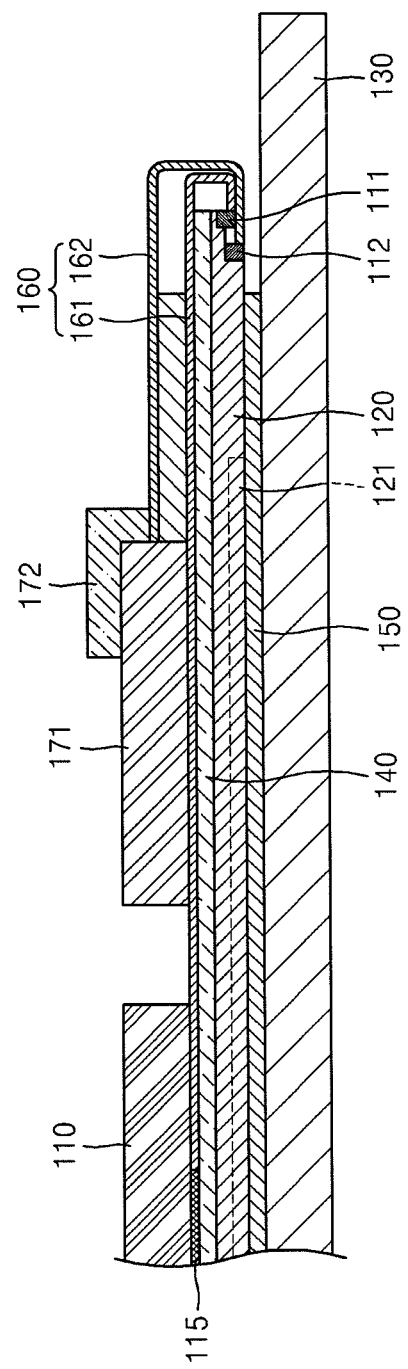
FIG. 2 is a magnified side view of portion A of the flexible display module of FIG. 1.
Figure 3:
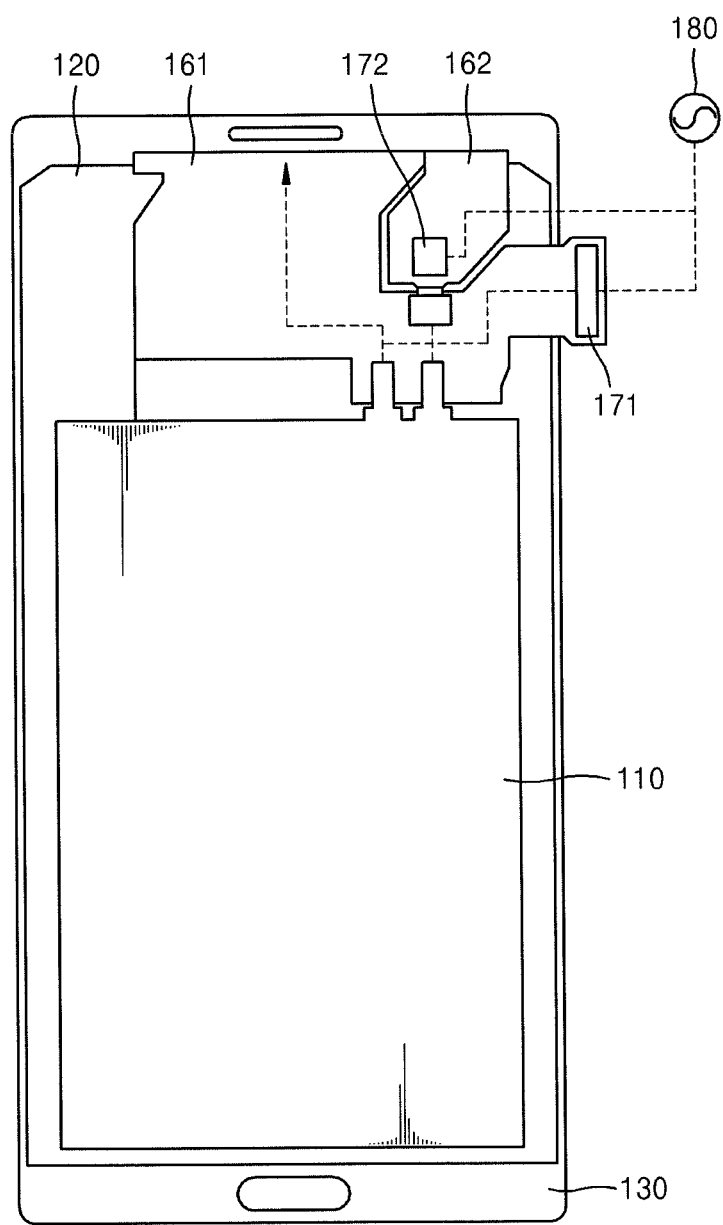
FIG. 3 is a plan view of the flexible display module of FIG. 1.
Figure 4:
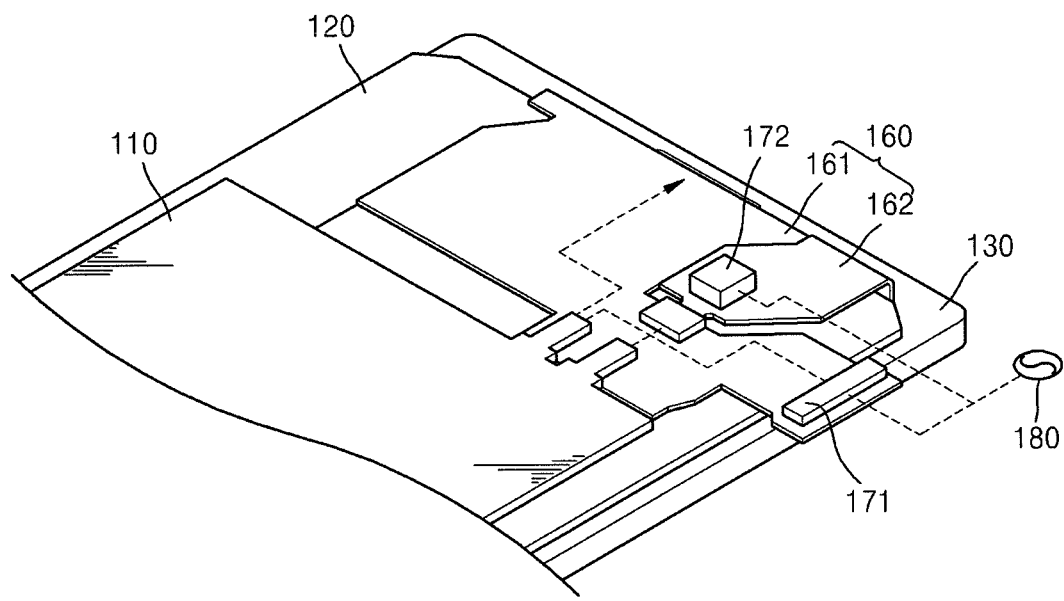
FIG. 4 is a perspective view of the flexible display module of FIG. 1.

FIGS. 1 through 4 illustrate a flexible display module 100 according to an example embodiment. FIGS. 1 and 2 are side views, FIG. 3 is a plan view, and FIG. 4 is a perspective view.

As illustrated in FIGS. 1 through 4, the flexible display module 100 according to the present example embodiment includes a flexible image display panel 120, a window 130 attached on one side of the panel 120 with an adhesive layer 150 therebetween, and a built-in battery 110 in a form of a sheet to supply, not an external, but an internal power source.

In the present example embodiment, a printed circuit board 160 connecting an external power source 180 to the inner area of the module 100 is further included. The printed circuit board 160 includes a first printed circuit board 161 connecting a driver IC chip 111 of the panel 120 to the external power source 180 through a first connector 171, and a second printed circuit board 162 connecting a touch-screen functional chip 112 of the panel 120 to the external power source 180 through a second connector 172. The built-in battery 110 is connected to the first and second printed circuit boards 161 and 162 to supply the internal power source respectively to the driver IC 111 and the touch-screen functional chip 112. The built-in battery 110 may be charged through the first printed circuit board 161 to receive power from the external power source 180

The driver IC chip 111 drives the display unit 121 provided on the panel 120. The display unit 121 may be formed in a general structure in which a thin film transistor and light emitting diodes are laminated.

The touch-screen functional chip 112 processes touch signals which operate the panel 120 when a user touches on the window 130.

As described above, the driver IC chip 111 or touch-screen functional chip 112 are not only connected to the external power source 180, but also connected to the built-in battery 110 which supplies the internal power source. Therefore, even when the external power source 180 is cut off, the module 100 may be operated using the power of the built-in battery 110.

In the present example embodiment, a heat-radiating sheet 115 is formed between the panel 120 and the built-in battery 110 to quickly radiate heat generated from the built-in battery 110. The heat-radiating sheet 115 may be formed of a graphite material.

In the present example embodiment, a cover tape 140 which protects the surface of the panel 120 is provided.

Hereinafter, a method of using the flexible display module 100 according to an example embodiment will be described in detail.

First, when the external power source 180 is used to operate the flexible display module 100, the flexible display module 100 is connected to the external power source 180 via the first and second connectors 171 and 172 of the first and second printed circuit boards 161 and 162.

Then, power of the external power source 180 is supplied to the driver IC chip 111 and the touch-screen functional chip 112 via the first and second printed circuit boards 161 and 162. Simultaneously, the built-in battery 110 is charged by the power of the external power source 180.

When the power supplied from the external power source 180 is cut off, the power charged in the built-in battery 120 is supplied to the driver IC chip 111 and the touch-screen functional chip 112, via the first and second printed circuit boards 161 and 162. Therefore, even when the connection to the external power source 180 is cut off, the panel 120 may be operated by using the power of the built-in battery 110.

According to this structure, even if the connection with the external power source 180 is faulty, the module 100 may be self-driven by using the built-in battery 110. Therefore, a flexible display module 100 may be provided in which the power supply is stable in a variety of conditions.

In addition, the heat that may be generated from the built-in battery 110 may be quickly radiated by the heat-radiating sheet 115. Thus, an overheating problem may be controlled. Furthermore, the graphite heat-radiating sheet 115 helps protect the panel 120 from external shocks. Even though one side of the panel 120 is protected by the window 130, the other side may be vulnerable to external shocks. However, if the heat-radiating sheet 115 is provided, a greater amount of external shocks may be prevented from being transferred to the panel 120. Thus, shock resistance may be enhanced.

Figure 5:
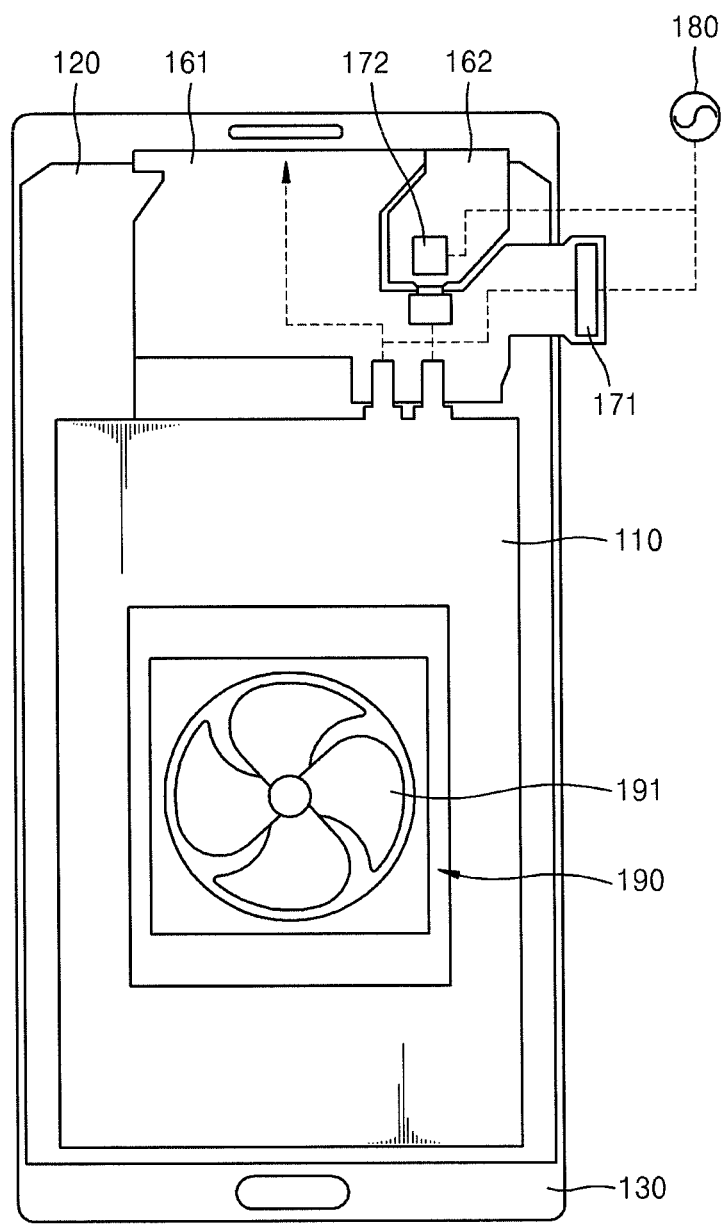
FIG. 5 is a plan view illustrating a modified structure of the flexible display module of FIG. 1.

In the previous embodiment, a cooling structure of which the heat-radiating sheet 115 is used to radiate heat generated from the built-in battery 110 is provided. In an implementation, a separate cooling device 190 as illustrated in FIG. 5 may be further included.

In an example embodiment, a cooling fan 191 may be provided adjacent to the built-in battery 110 to directly cool the heat that may be generated from the built-in battery 110. The power to operate the cooling fan 191 may also be supplied selectively either from the external power source 180 or built-in battery 110. Thus, a flexible display module with more stability regarding the radiation of heat may be provided.

By way of summation and review, a flexible display module may include a panel in which a display unit, a driver integrated circuit (IC) chip, and the like are provided thereon, a window covering the panel, and a printed circuit board connecting the driver IC of the panel to an external power source.

When the power source and the driver IC are connected through the printed circuit board, power may be supplied to the driver IC, and the display unit may start operating. However, such a structure described above, a module may not be self-driven without an external power source. Thus, if the connection with the external power source experiences a fault, the module immediately falls into a non-operable state. Also, because a totally flexible printed circuit board is used, protecting the panel from external shocks may be difficult.

As described above, embodiments may provide a flexible display module formed in a structure to improve the weaknesses of a general module. Embodiments may provide a flexible display module which may be self-driven without being connected to an external power source. Embodiments may also provide a flexible display module which has a structure to help protect a panel from external shocks.

The flexible display module according to embodiments may be self-driven without an external power source. Thus, even when a main power source is faulty, emergency power may be supplied, and thus a stable power supplying system may be embodied. Also, the flexible display module according to embodiments may safely protect a panel from external shocks. Therefore, a very stable and efficient display device may be embodied by using the flexible display module according to embodiments.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A flexible display module, comprising:
a flexible panel having a display unit thereon;
a built-in battery which supplies an internal power source to the flexible panel, for driving the display unit;
a driver IC chip provided on the flexible panel to drive the display unit;
a touch-screen functional chip;
a first printed circuit board connected to the driver IC chip, the built-in battery to supply power to the driver IC chip through the first printed circuit board, the built-in battery being charged in a state of being connected to an external power source through the first printed circuit board; and
a second printed circuit board connected to the touch-screen functional chip, the built-in battery to supply power to the touch-screen functional chip through the second printed circuit board.

2. The flexible display module according to claim 1, further comprising:
a first connector connecting the first printed circuit board to the external power source; and
a second connector connecting the second printed circuit board to the external power source.

3. The flexible display module according to claim 1, further comprising a window covering a side of the flexible panel, the window protecting the first printed circuit board and the second printed circuit board.

4. The flexible display module according to claim 3, wherein a heat-radiating sheet is provided directly on an opposite side of the flexible panel and directly between the flexible panel and the built-in battery to radiate heat generated from the built-in battery.

5. The flexible display module according to claim 4, wherein the heat-radiating sheet includes a graphite material.

6. The flexible display module according to claim 4, further comprising a cooling device to cool heat generated from the built-in battery.

7. The flexible display module according to claim 6, wherein the cooling device includes a cooling fan.

8. The flexible display module according to claim 3, wherein:
the built-in battery is in a form of a sheet that extends in a plane parallel to a plane of the flexible panel, and
the flexible panel is interposed between the built-in battery and the window.

9. The flexible display module according to claim 1, wherein the built-in battery is in a form of a sheet.

10. The flexible display module according to claim 9, wherein the built-in battery is in a form of a sheet that extends in a plane parallel to a plane of the flexible panel.

* * * * *